United States Patent [19]

Yamamoto et al.

[11] 4,274,103
[45] Jun. 16, 1981

[54] AVALANCHE PHOTODIODE WITH SEMICONDUCTOR HETERO STRUCTURE

[75] Inventors: Takaya Yamamoto, Niza; Kazuo Sakai, Tokyo; Shigeyuki Akiba, Tanashi, all of Japan

[73] Assignee: Kokusai Denshin Denwa Kabushiki Kaisha, Tokyo, Japan

[21] Appl. No.: 50,628

[22] Filed: Jun. 21, 1979

[30] Foreign Application Priority Data

Jul. 17, 1978 [JP] Japan .................................. 53-86130

[51] Int. Cl.$^3$ .................. H01L 29/90; H01L 29/161; H01L 27/14
[52] U.S. Cl. ........................................ 357/13; 357/16; 357/30
[58] Field of Search ............................. 357/13, 30, 16

[56] References Cited

U.S. PATENT DOCUMENTS 4,110,778  8/1978  Eden et al. .............................. 357/30
4,212,019  7/1980  Wataze .................................... 357/13

*Primary Examiner*—Martin H. Edlow
*Attorney, Agent, or Firm*—Robert E. Burns; Emmanuel J. Lobato; Bruce L. Adams

[57] ABSTRACT

An avalanche photodiode with a semiconductor hetero structure, in which a light absorbing region and an avalanche multiplying region where avalanche gain is attained are formed of different materials. The different materials may be two compound semiconductors of different compositions. The lattice constants of the two compound semiconductors may be matched with each other.

4 Claims, 5 Drawing Figures

AVALANCHE PHOTODIODE WITH SEMICONDUCTOR HETERO STRUCTURE

BACKGROUND OF THE INVENTION

1. Field of the Invention

This invention relates to a semiconductor avalanche photodiode (hereinafter referred to as the APD).

2. Description of the Prior Art

The APD is a photo detector having a signal amplifying function and has excellent properties of small size, high sensitivity and high-speed response. In the APD, however, the noise characteristic in an avalanche multiplying region where avalanche gain is attained is not sufficient for an arbitrary wavelength. Especially, a high sensitivity APD operating in a wavelength region longer than 1 μm poses many problems in terms of dark current and noise. The cause of this is considered to reside in that the prior art is based on the concept that an avalanche multiplying region (hereinafter also referred to as an "avalanche region") and a light absorbing region (that is, a photoelectric conversion region) of the APD are formed of the same material, which makes the selection of material very difficult. In a case where the APD is formed of a single substance, for example, Si or Ge, Si does not present serious problems with respect to the noise characteristics and the dark current, but the light absorbing characteristic of Si limits the receiving light wavelength to less than 1.1 μm, while on the other hand Ge is sensitive to a light of the wavelength up to 1.6 μm but has a defect such that an avalanche noise and the dark current are large. Accordingly, in a case of using wavelengths in the vicinity of 1.3 μm, which is regarded as promising in an optical fiber transmisson system, even if use is made of Si, Ge or some other materials, the APD made of a single material is difficult to simultaneously satisfy the requirements of high sensitivity, low noise, low dark current and so forth.

SUMMARY OF THE INVENTION

An object of this invention is to provide an avalanche photodiode with a semiconductor hetero structure in which the avalanche region and the light absorbing region are respectively made of different materials to thereby overcome such defects as described above.

According to this invention, there is provided an avalanche photodiode with a semiconductor hetero structure, in which a light absorbing region and an avalanche multiplying region where avalanche gain is attained are formed of different materials. The different materials may be two compound semiconductors of different compositions. The lattice constants of the two compound semiconductors may be matched with each other.

BRIEF DESCRIPTION OF THE DRAWING

This invention will be hereinafter described in detail with reference to the accompanying drawing, in which.

DETAILED DESCRIPTION

Figure 1:
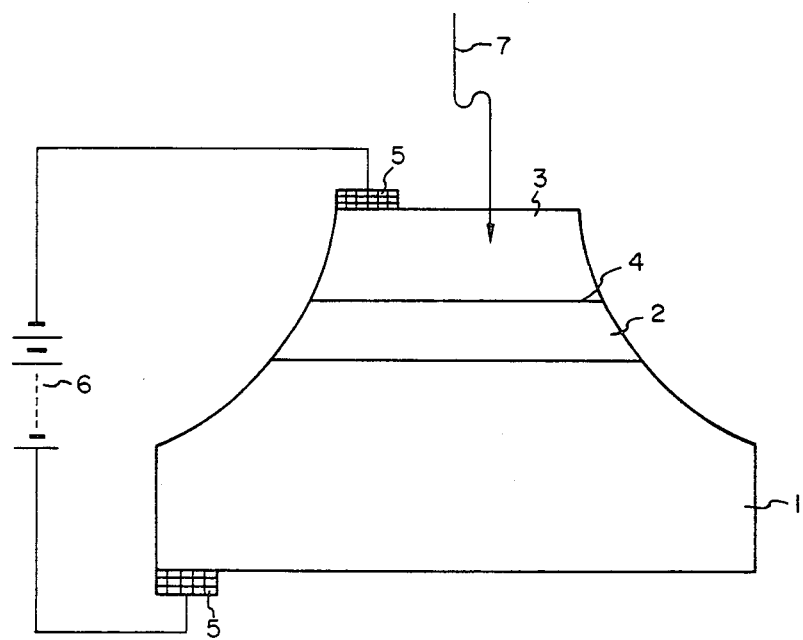
FIG. 1 is a cross sectional view showing a model having an avalanche region formed of Si and a light absorbing region of Ge, explanatory of the principles of the HAPD.

FIG. 1 illustrates a basic example of a hetero-structure APD (hereinafter referred to as the HAPD) formed of Si and Ge in combination. That is, in order to achieve high-sensitivity and low-noise performance even at the wavelengths longer than 1.1 μm, the HAPD is formed by employing p+ or p type Ge for the light absorbing region 3, n− or i type Si for the avalanche region 2 and n+ type Si for a substrate 1 and is arranged so that a light 7 to be detected is incident to the light absorbing region 3, with a bias source 6 connected between the regions 3 and 1 via electrodes 5. As Si and Ge greatly differ in lattice constant from each other, a lattice mismatch occurs in a boundary 4 of the hetero junction, making it difficult to realize such a HAPD as shown in FIG. 1; however, the problem of lattice mismatching at the boundary of the hetero junction can be solved through utilization of a compound semiconductor. The following description will be given with regard to a case of employing the compound semiconductor with which it is possible to obtain such an HAPD.

In many compound semiconductors consisting of two, three or four elements, they have the same lattice constant although different in composition. Accordingly, if materials of the same lattice constant are respectively employed for the avalanche region and the light absorbing region, there does not occur such a problem at the boundary of the hetero junction as is seen in the combination of Si and Ge, and hence an HAPD of high quality can be obtained.

Figure 2:
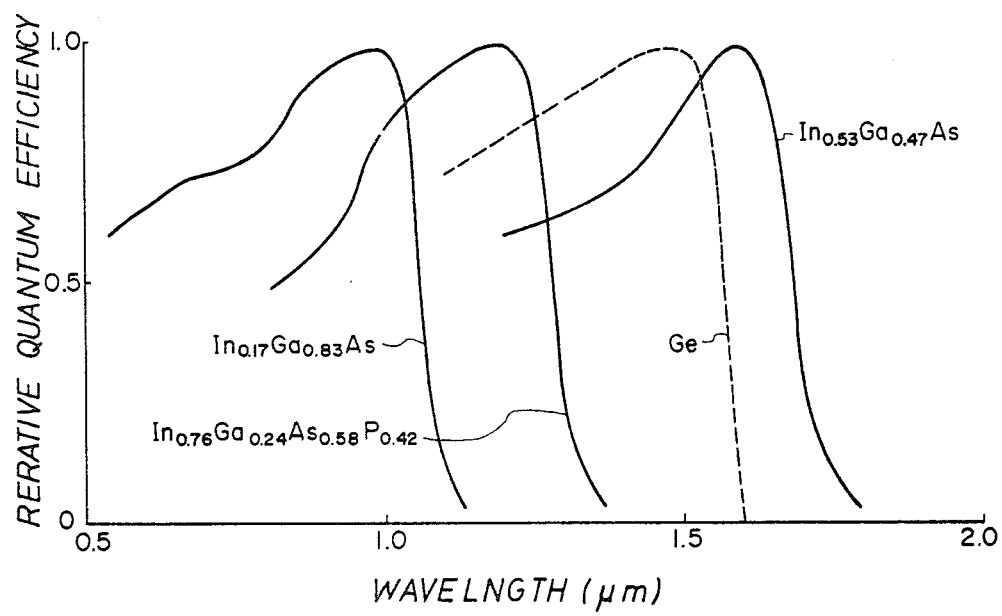
FIG. 2 is a characteristic diagram showing examples of the light absorbing characteristics of a compound semiconductor $In_{1-x}Ga_xAs_yP_{1-y}$ and Ge.
Figure 3:
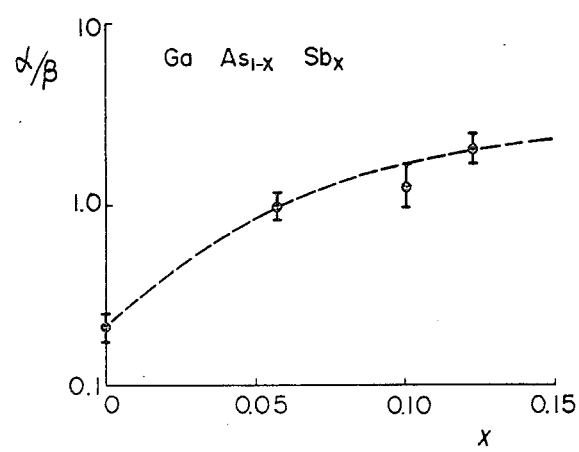
FIG. 3 is a characteristic diagram showing that the ratio of ionization rate in $GaAs_{1-x}Sb_x$ greatly changes with a composition rate x.

Next, a description will be made of the noise and wavelength characteristics of the compound semiconductors. The responsivity to the light of most of the compound semiconductors are already known and here exist many light absorbing materials which exhibit high efficiency even at the wavelengths longer than 1 μm, as shown in FIG. 2. Furthermore, the noise characteristic of the avalanche region is chiefly dependent on the ratio between the ionization rates of electrons and holes in the material used; but this has been studied only for a few compositions. However, a change in the composition causes a great variation of the ratio in the ionization rate; it has been experimentally assertained that in a case of $GaAs_{1-x}Sb_x$ or $In_{1-x}Ga_xAs$ ($0 \leq x \leq 1$), the above-mentioned ratio greatly varies with the value of x. FIG. 3 shows the case of $GaAs_{1-x}Sb_x$.

Now, a brief description of the relationship between the ratio in the ionization rate and the noise of the APD is made. In the APD, electron-hole pairs ionized by light are given energy from a strong electric field of the avalanche region and again ionized and, by repeating this, an original light signal is amplified. In the course of this ionization, however, the noise component is multiplied more than the signal. The multiplication rate of noise to that of signal in this case is called an excess noise factor F, which is used for indicating the noise characteristic of the APD and, of course, F=1 is ideal. This factor F is determined by a ratio, $\alpha/\beta$, where $\alpha$ and $\beta$ are the ionization rates of electrons and holes, respectively. The factor F is maximum when $\alpha/\beta = 1$. Ge corresponds to this case, which is the worst in terms of the noise characteristic. In contrast thereto, when $\alpha/\beta \ll 1$ or $\alpha/\beta \gg 1$, the factor F assumes a value close to 1, providing an APD of small noise. In the example of $GaAs_{1-x}Sb_x$ shown in FIG. 3, the ratio, $\alpha/\beta$, becomes 1 to provide the worst noise characteristic when x is around 0.05, but in cases of x being of other values, the above-mentioned ratio takes other values than 1. Therefore, if the composition in which x maximizes the ratio, $\alpha/\beta$ or $\beta/\alpha$, is used for the avalanche region, the noise is less than in cases of using the materials of other compositions. Accordingly, with the use of such a compound semiconductor, it is possible to select in the avalanche region such a composition which minimizes the noise. The HAPD can be obtained by producing a hetero junction by a material having the same lattice constant as that of the above-mentioned composition and a material of light absorbing region having the highest sensitivity at a desired wavelength.

Figure 4A:
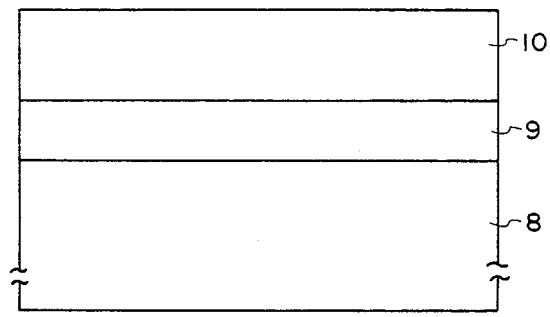
FIGS. 4A and 4B are cross sectional views illustrating an example of the HAPD formed of InP and $In_{0.53}Ga_{0.47}As$.
Figure 4B:
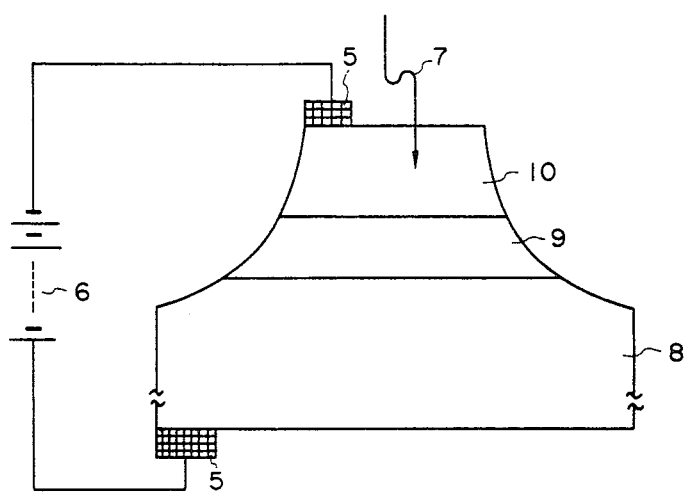

As a specific operative example employing the compound semiconductor, the HAPD will be described which is formed of $In_{1-x}Ga_xAs_yP_{1-y}$ ($0 \leq x$, $Y \leq 1$) regarded as a promising material for an optical transmission line using longer wavelengths than 1 μm. With this material, if an InP substrate is employed as a substrate for crystal growth, complete lattice matching can be achieved by changing the composition at the rate, $x:y \simeq 0.47:1$, making it possible to respond to lights of wavelengths of up to about 1.7 μm. However, the ratio of ionization rates in this composition has not as yet been known much, and accordingly it is not clear what values of x and y are optimum in the composition of the material for the avalanche region. FIGS. 4A and 4B show the HAPD in which, on the assumption that the ionization rate of electrons is sufficiently higher than that of holes in InP, $x=y=0$, that is, InP is used for the avalanche region and $x=0.47$ and $y=1$, that is, $In_{0.53}Ga_{0.47}As$ is used for the light absorbing region. The fabrication of this device follows the following steps: For example, as depicted in FIG. 4A, an $n^-$ or i type InP layer 9 and p or $p^+$ type $In_{0.53}Ga_{0.47}As$ layer 10 are successively grown by a continuous liquid phase epitaxial growth method on an $n^+$ type InP substrate 8 to obtain a hetero structure wafer. Then, as shown in FIG. 4B, after the wafer is selectively etched into mesa form so as to prevent breakdown at the periphery of the diode, electrodes are attached to the wafer on the n— and p— sides to put the pn junction in a reverse biased condition. With this HAPD, since the light absorbing region is formed of $In_{0.53}Ga_{0.47}As$, lights of wavelengths up to 1.7 μm can be detected.

The compound semiconductor for the HAPD includes not only the above-mentioned $In_{1-x}Ga_xAsP_{1-x}$ but also many other materials, but the materials which achieves lattice-matching with the substrate for crystal growth and has provided a relatively excellent hetero junction are such as shown in the following Table 1.

TABLE 1

| Growth layer composition | Substrate | Maximum receiving light wavelength |
|---|---|---|
| $In_{1-x}Ga_xAs_yP_{1-y}$ | GaAs | 0.9 μm |
| $In_{1-x}Ga_xSb_yP_{1-y}$ | InP | 1.0 μm |
| $In_{1-x}Ga_xAs_yP_{1-y}$ | InP | 1.7 μm |
| $Al_{1-x}Ga_xAs_ySb_{1-y}$ | GaSb | 1.7 μm |
| $In_{1-x}Ga_xAs_ySb_{1-y}$ | InAs | 3.0 μm |

It is a matter of course that the present invention is not limited specifically to the materials of the embodiments described above.

As has been described above in detail, in the present invention the light absorbing region is formed of a material which exhibits the highest quantum efficiency with respect to the working wavelength and the avalanche region is formed of a material which is high in gain and optimum for a low-noise operation; therefore, the APD of this invention has the advantages of high efficiency, high gain and low noise, as compared with the prior art APD in which the both regions are formed of the same material.

The APD of such a semiconductor hetero structure is usable in the fields of optical communication systems and optical information processing systems and is of great utility.

What we claim is:

1. An avalanche semiconductor photodiode having a semiconductor heterostructure and comprising: a semiconductor light absorbing region comprising $In_{1-x}Ga_xAs_yP_{1-y}$, wherein $0 < x \leq 1$ and $0 < y \leq 1$; and a semiconductor avalanche multiplying region comprising InP.

2. An avalanche semiconductor photodiode according to claim 1, wherein the ratio x/y is substantially equal to 0.47/1 so that the respective lattice constants of said light absorbing region and said avalanche multiplying region are matched with each other.

3. An avalanche semiconductor photodiode comprising: a semiconductor substrate; a first semiconductor layer formed on a surface of said substrate and conducting in an avalanche mode, in operation; and a second semiconductor layer formed on a surface of said first semiconductor layer opposite said substrate, said second semiconductor layer receptive of light energy from light incident thereon in use for rendering the photodiode conductive, and said second semiconductor layer having a composition including chemical components different than the composition of said first semiconductor layer and having lattice constants substantially matched with the lattice constants of said first semiconductor layer, wherein said first and said second semiconductor layers are respectively comprised of one of the pairs of compounds selected from the group consisting of $In_{1-x}Ga_xAs_yP_{1-x}$ and GaAs,
$In_{1-x}Ga_xSb_yP_{1-y}$ and InP,
$In_{1-x}Ga_xAs_yP_{1-y}$ and InP,
$Al_{1-x}Ga_xAs_ySb_{1-y}$ and GaSb, and
$In_{1-x}Ga_xAs_ySb_{1-y}$ and InAs.

4. An avalanche semiconductor photodiode according to claim 3, wherein the parameter x is selected to minimize the noise of the photodiode.

* * * * *